United States Patent
Yamauchi

(10) Patent No.: US 6,788,044 B2
(45) Date of Patent: Sep. 7, 2004

(54) FREQUENCY CHANGE MEASURING DEVICE

(75) Inventor: Tsuneo Yamauchi, Kasugai (JP)

(73) Assignee: President of Nagoya University, Nagoya (JP)

( * ) Notice: Subject to any disclaimer, the term of this patent is extended or adjusted under 35 U.S.C. 154(b) by 35 days.

(21) Appl. No.: 10/359,575

(22) Filed: Feb. 7, 2003

(65) Prior Publication Data

US 2003/0117122 A1 Jun. 26, 2003

Related U.S. Application Data

(62) Division of application No. 09/819,851, filed on Mar. 29, 2001, now Pat. No. 6,608,474.

(30) Foreign Application Priority Data

Mar. 31, 2000 (JP) ........................................ 2000-098871

(51) Int. Cl.[7] .............................................. G06M 1/10
(52) U.S. Cl. ................................ 324/76.16; 324/76.41; 324/76.48; 327/48
(58) Field of Search .......................... 324/76.16, 76.39, 324/76.41, 76.48, 76.62; 702/75, 76, 78; 327/41–49, 160; 377/20, 44

(56) References Cited

U.S. PATENT DOCUMENTS 5,657,361 A * 8/1997 Inagaki et al. ................. 377/39
5,764,045 A * 6/1998 Hayashi ..................... 324/76.48

* cited by examiner

*Primary Examiner*—Vincent Q. Nguyen
(74) *Attorney, Agent, or Firm*—Oblon, Spivak, McClelland, Maier & Neustadt, P.C.

(57) ABSTRACT

A frequency change measuring device includes frequency divider for frequency dividing a measuring signal to produce frequency-divided signals, first counter for counting the frequency-divides signals to calculate frequency-division numbers, frequency division numbers transmitter for transmitting the frequency division numbers in synchronism with the frequency-divided signals, frequency division numbers receiver for receiving the frequency division numbers transmitted from the frequency division numbers transmitter, second counter for counting outputs of a reference clock generator synchronized with a timekeeping device that keeps the standard time, latch unit for latching a count of frequency outputs of the reference clock generator synchronous for generating reference clocks on the basis of signals synchronous with the frequency division numbers, and operations unit for determining a frequency change on the basis of the count and the frequency division numbers.

2 Claims, 5 Drawing Sheets

FREQUENCY CHANGE MEASURING DEVICE

CROSS-REFERENCE TO RELATED APPLICATIONS

This application is a divisional application of, and claims priority to, Ser. No. 09/819,851 filed Mar. 29, 2001 now U.S. Pat. No. 6,608,474 which claims priority to Japanese Application No. JP 2000-098871 filed Mar. 31, 2000. The entire contents of the parent application is incorporated herein by reference.

BACKGROUND OF THE INVENTION

The present invention relates to a frequency change measuring device that measures changes in frequency to measure changes in a physical quantity.

Conventional methods for measuring a change in a physical quantity in terms of a frequency change involve using a variable-capacitance displacement sensor whose electrical capacitance is varied by a change in the physical quantity and measuring a change in an oscillator frequency caused by that sensor.

There are two such methods. The first method involves dividing the output frequency of the sensor which varies with a change of the physical quantity to define gating times and counting reference clock pulses within the interval between each gating time. The second method involves dividing a reference clock frequency within the measuring device to define gating times and counting the output frequency of the sensor within the interval between each gating time.

The first and second methods are common to each other in that a change in the sensor output frequency is measured in terms of a change in count value and an operation is performed on the count value to thereby determine a change in the physical quantity. Usually, the precise frequency measurements by those known methods require the reference clock frequency to be stabilized using a thermostatic oven or the like.

In FIG. 1 there is illustrated an example of a frequency change measuring device which implements such methods as described above. The measuring device is composed of a displacement detector 80 and an operations unit 70. The displacement detector comprises a variable-capacitance displacement sensor 81 which detects a change in a physical quantity as a change in its electrical capacitance and an oscillator 82 using the sensor as its frequency determining component. The operations unit 70 comprises a reference clock generator 71 which generates a clock signal as reference of measurement timing, a frequency divider 72 for dividing the output frequency of the reference clock generator, a gate circuit 73 for defining gating times from the output signal from the frequency divider, a counter 74 for counting the output frequency of the displacement sensor 80 in the interval between each gating time, a latch circuit 75 for holding the count in the counter, and an operations circuit 76 for performing operations on the count read from the latch circuit to determine the change in the physical quantity.

In the arrangement of FIG. 1 in which the oscillating frequency is varied in sympathy with a physical quantity, the resolution of frequency is improved by increasing the gating interval (window) between gating times, making it easy to detect variations in the physical quantity. However, as the gating interval becomes longer, it becomes more susceptible to variations and the magnitude of errors in frequency measurement increases. To decrease the magnitude of measurement errors, the gating interval is simply stabilized. To stabilize the gating interval, the reference clock generator is used put in a thermostatic oven. Power must be continuously applied to the operations unit 70 including the thermostatic oven during frequency measurement. The thermostatic oven needs large consumptive electrical power. In the field where a battery must be used as a power supply, therefore, measurements cannot be made over a long period of time.

In the above arrangement, if a cable used to send a signal from the displacement detector 80 to the operations unit 70 is long, then the signal will suffer attenuation within the cable. That is, since an oscillator output signal of the detector 80 is sent as it is to the operations unit 70 as the measuring signal, the signal is subject to attenuation. In particular, when the frequency of the measuring signal is high, the amount of attenuation is great and the distance over which the signal can be transmitted is short.

With the conventional frequency measuring device, as described above, when the gating interval is made long to increase the frequency resolution, it is susceptible to variation and hence the frequency measurement error increases in magnitude. The power must be applied continuously to the device which includes the thermostatic oven requiring large consumptive power during measurement. When the cable between the detector and the operations unit is long, the measured signal sent over the cable suffers considerable attenuation.

BRIEF SUMMARY OF THE INVENTION

It is an object of the present invention to provide a frequency change measuring device which has no requirement for a thermostatic oven for stabilizing the frequency output of a reference clock generator.

According to a first aspect of the present invention, there is provided a frequency change measuring device including at least one frequency divider for frequency dividing a measuring signal whose frequency is varied by a change in a physical quantity to produce frequency-divided signals; at last one counter for counting the frequency-divided signals to calculate frequency-division numbers; at least one frequency division numbers transmitter for transmitting the frequency division numbers in synchronism with the frequency-divided signals; a frequency division numbers receiver for receiving the frequency division numbers receiver for receiving the frequency division numbers transmitted from the frequency division numbers transmitter to output the frequency division numbers; a reference clock generator for generating reference clocks; and an operations unit for determining a change in the frequency of the measuring signal on the basis of the frequency outputs of the reference clock generator and the frequency division numbers.

According to a second embodiment of the present invention, there is provided a frequency change measuring device including at least one frequency divider for frequency dividing a measuring signal whose frequency is varied by a change in a physical quantity to produce frequency-divided signals; at least one first counter for counting the frequency-divided signals to calculate frequency-division numbers; at least one frequency division numbers transmitter for transmitting the frequency division numbers in synchronism with the frequency-divided signals; a frequency division numbers receiver for receiving the frequency division numbers transmitted from the frequency division numbers transmitter to output the frequency division numbers; a second counter for counting an output of a reference clock generator which generates reference clocks; a latch unit for latching a count of the second counter on the basis of signals synchronous with the frequency division numbers from the frequency division numbers receiver; and an operations unit for determining a change in the frequency of the measuring signal on the basis of the count latched by the latch unit and the frequency division numbers.

The frequency change measuring device preferably further comprises a power supply for driving the frequency division numbers receiver, the second counter, the latch unit, and the operations unit, the power supply being turned on intermittently.

There may exist a plurality of measuring signals, the frequency divider, the first counter and the frequency division numbers transmitter each correspond in number to the measuring signals, and the frequency division numbers calculated from the measuring signals are received by at least one freqency division numbers receiver.

Preferably, the frequency divider, the first counter and the frequency division numbers transmitter are packed together as a frequency dividing unit, and the frequency division numbers receiver, the second counter, the latch unit and the operations unit are packed together as a frequency operations unit, and the transmission of the frequency division numbers from the frequency division numbers transmitter to the frequency division numbers receiver is made by radio communication.

Preferably, the reference clock generator operates in synchronism with a timekeeping device for the standard time.

Preferably, the device includes a scheduler for scheduling the on-off control of the power supply on the basis of the output of the operations unit.

In the frequency change measuring device of the present invention, to measure times at which the frequency-divided signals are produced, use is made of the frequency output of the reference clock generator synchronized with the timekeeping device for the standard time with little timekeeping error. Thus, even if the time interval between each frequency-divided signal is prolonged, no measurement error accumulates. For this reason, there is no need to stabilize the frequency output of the reference clock generator through the use of a thermostatic oven which requires large consumptive power, effecting a reduction in the power consumption of the measuring device and allowing a battery-powered frequency change measuring device to be manufactured which is compact and handy to carry about.

For example, when the frequency output of the reference clock generator is 1 MHz, the times at which the frequency-divided signals are produced can be determined with an accuracy of ±1.0 $\mu$sec. When the frequency output of the reference clock generator is 1 KHz, the times at which the frequency-divided signals are produced can be determined with an accuracy of ±1.0 msec.

The standard time has been transmitted in the form of electromagnetic waves from communication satellites and ground stations and can be received all over the world. To receive the standard time, GPS clocks and radio-wave-based clocks are commercially available. These clocks are very precise and no timekeeping error accumulates with time. Thus, the frequency output of the reference clock generator is stable and hence is suitable for a time base for the reference time. For observation of physical phenomena in the fields where the electric power situation is bad, the frequency change measuring device of the present invention using a radio clock is handy and allows the standard time to be received with a small amount of power consumption. Thus, a compact, battery-powered frequency change measuring device can be implemented.

The frequency division unit sends the frequency division numbers resulting from frequency dividing a measuring signal to the frequency operations unit in synchronism with the generation of frequency-divided signals. The frequency division numbers contain information concerning changes in a physical quantity. The frequency division numbers are converted into bit signals, which in turn are sent to the frequency operations unit as low-frequency signals which can be transmitted even over a long cable. In the present invention, the frequency division numbers are transmitted by radio communication to the frequency operations unit in synchronism with the frequency-divided signals which also contain information concerning changes in the physical quantity.

The present invention can be adapted to a plurality of measuring signals. Thus, a single frequency operations unit can determine changes in a number of physical quantities or changes in a physical quantity at a number of points.

In the present invention, the power to the frequency operations unit is turned on intermittently to measure a change in the frequency of the measuring signal with low power consumption. The frequency operations unit precisely measures times at which the frequency-divided signals associated with the measuring signal were produced in the frequency division unit on the basis of the frequency output of the reference clock generator timed to the standard time clock device. Also, the frequency division numbers transmitted at those times can be known. Therefore, even when the frequency operations unit is intermittently powered, a change in the frequency of the measuring signal in the frequency division unit can be known from the times of production of intermittently obtained frequency-divided signals and the frequency division numbers at those times. A change in the physical quantity can be determined by performing operations on the frequency change.

In the present invention, since the frequency output of the reference clock generator synchronized with the standard time clock device is used, time errors are little accumulated. Thus, any change in the physical quantity can be detected by increasing the measuring interval. Even in the case where the frequency operations unit is operated intermittently, the difference between times at which the frequency-divided signals were produced can be known from the difference between frequency division numbers, allowing a change in the physical quantity to be determined with precision.

The present invention is especially useful in mounting a number of displacement sensors on the concrete walls of railroad or road tunnels or their surrounding bedrock and recording their movement over a long term at a point. The inventive measuring device, which can run on a battery over a long period of time, can detect long-term movement of the wall of tunnels and the surrounding bedrock and their abnormal movement which may result in collapse. In addition, the device does not require the battery to be exchanged often and is easy to maintain.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

[First Embodiment]

Figure 2:
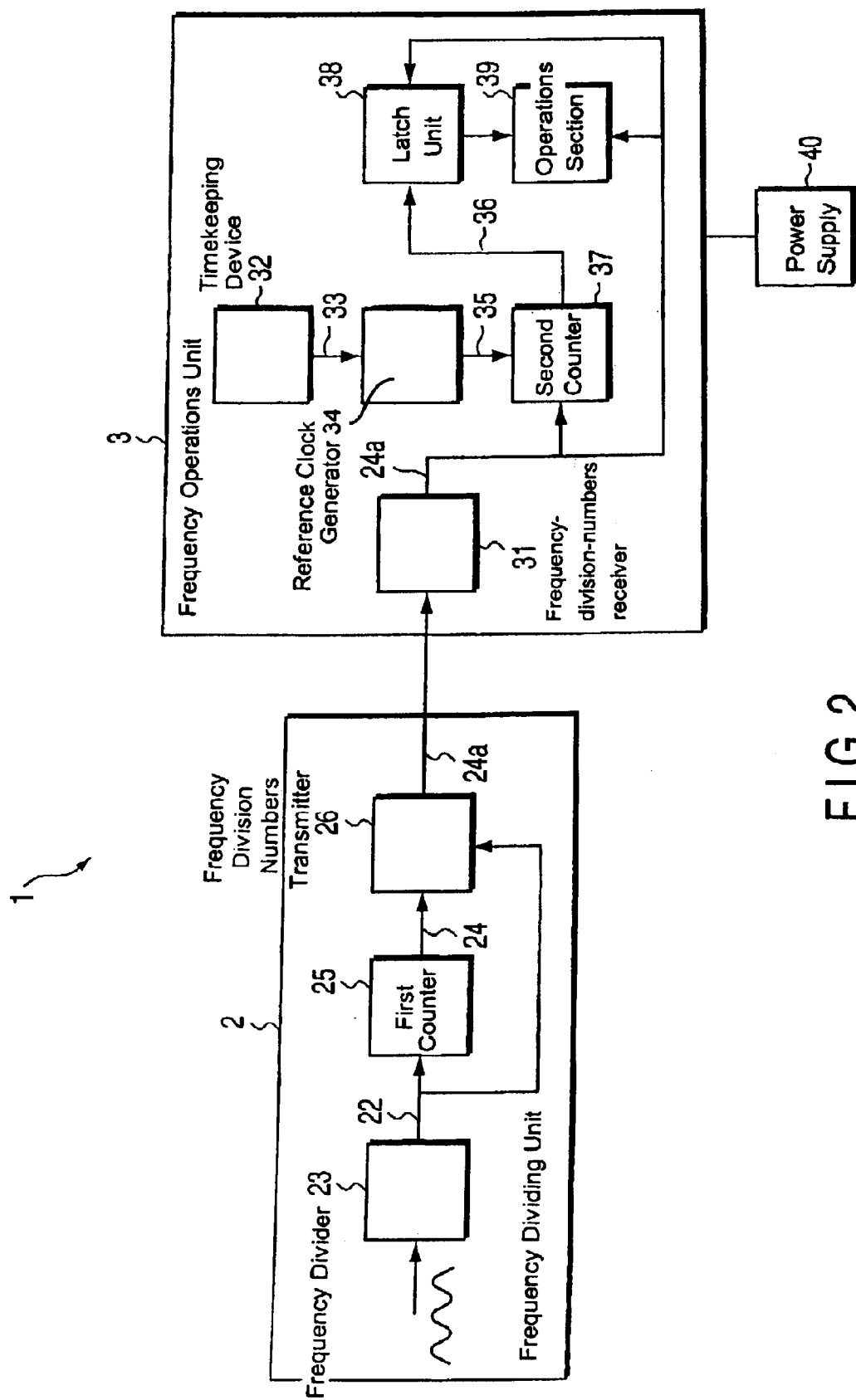
FIG. 2 is a block diagram of a frequency change measuring device according to a first embodiment of the present invention.

FIG. 2 is a block diagram of a frequency change measuring device according to a first embodiment of the present invention.

As shown in FIG. 2, the frequency change measuring device, indicated generally at 1, is composed of a frequency dividing unit 2 that divides the frequency of a measuring signal (a signal to be measured) which varies with a physical quantity, a frequency operations unit 3 that determines a change in the frequency of the measuring signal through operations on the basis of the number of frequency divisions synchronous with the divided signals sent from the frequency division unit, and a power supply 40 for driving the frequency operations unit.

The frequency dividing unit 2 comprises a frequency divider 23 for frequency dividing the measuring signal 21 to obtain frequency-divided signals 22, a first counter 25 for counting the frequency divided signal 22 to obtain the number 24 of frequency divisions (frequency division numbers), and a frequency division numbers transmitter 26 for transmitting by radio communication the frequency division numbers 24 in synchronization with the frequency-divided signals 22 as the synchronous frequency-division numbers 24a.

The frequency operations unit 3 comprises a frequency-division-numbers receiver 31 for receiving the synchronous frequency division numbers 24a sent from the frequency dividing unit 2, a second counter 37 that counts the output frequency 35 of a reference clock generator 34 generating clock pulses in synchronism with a timekeeping signal 33 from a timekeeping device 32 registering a standard time and provides a count output 36, a latch unit 38 for holding the count (count value) 36 output in synchronism with the frequency division numbers 24a, and an operations section 39 that determines a change in frequency on the basis of the count 36 and the frequency division numbers 24a.

The timekeeping device 32 may be a radio clock or GPS clock. In the case of the GPS clock, timekeeping signals are received from satellites each having an atomic clock aboard, thereby allowing timekeeping.

Figure 3A:
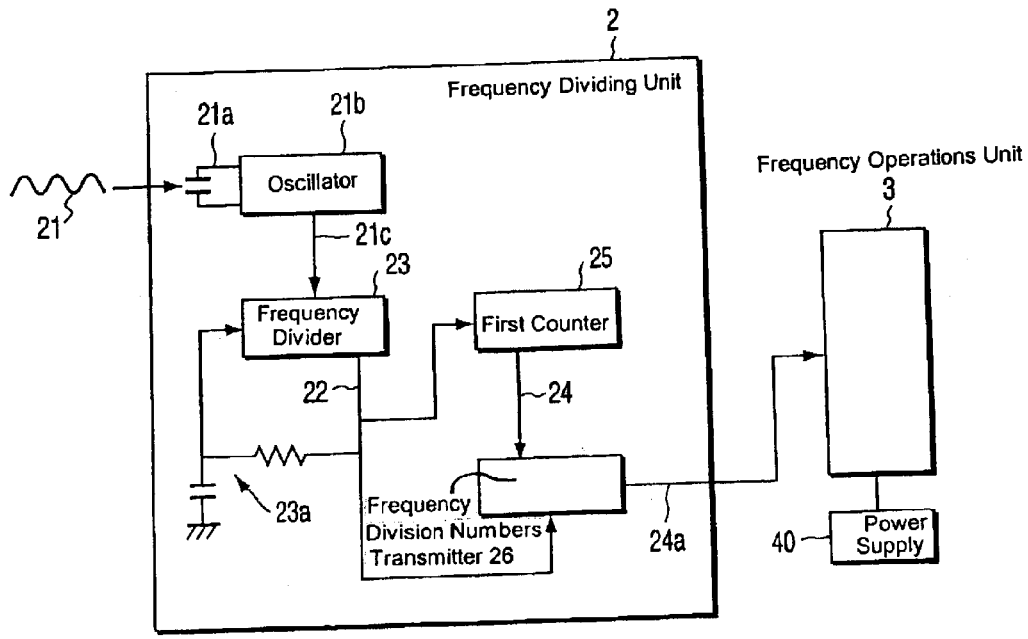
FIGS. 3A and 3B shows modifications of the frequency change measuring device of the first embodiment.
Figure 3B:
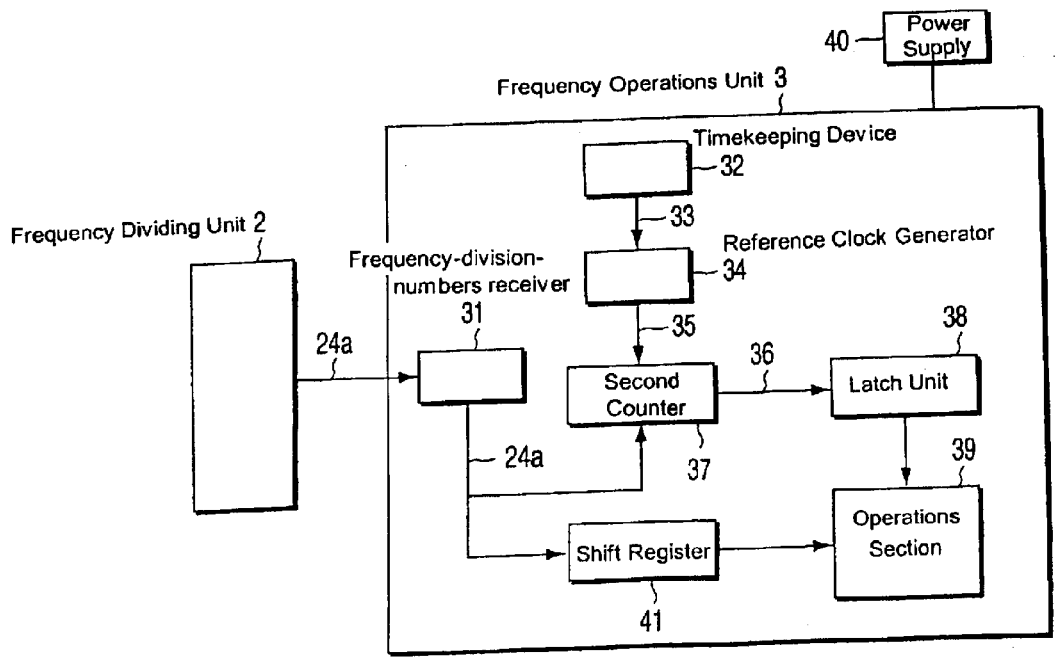

FIGS. 3A and 3B show specific arrangements of the frequency change measuring device of the present invention based on the basic arrangement thereof. FIG. 3A shows a detailed arrangement of the frequency dividing unit 2 and FIG. 3B shows a detailed arrangement of the frequency operations unit 3.

As shown in FIG. 3A, an oscillator 21b, the frequency of which is varied by the capacitance of a variable-capacitance displacement sensor 21a being varied by the measuring signal 21, provides a frequency output 21c.

The frequency output 21c is then frequency divided by a counter HC4040 serving as the frequency divider 23. The frequency-divided output signal 22 is delayed by an RC circuit 23a to reset the counter. The output signal 22 of the counter 23 is at a high level while it is being delayed by the RC circuit 23a, i.e., until the counter is reset. The frequency-divided signals 22 are output to the first counter 25 (HC590) which counts the frequency-divided signals 22 to calculate the number of frequency division numbers 24 (the count of the frequency-divided signals). The frequency-division-numbers output 24 is then applied to a shift register HC165 as the frequency-division-numbers transmitter 26, from which the frequency-division numbers data 24 is transmitted bit-serially and synchronously with the frequency-divided signals 22 to the frequency operations unit 3 by radio communication as synchronous frequency-division-numbers data 24a.

The output of the shift register 26 (the synchronous frequency-division-numbers data 24a) may be transmitted in parallel-by-bit form over multiple signal lines to the frequency operations unit 3.

As shown in FIG. 3B, the synchronous frequency-division-numbers data 24a transmitted from the frequency dividing unit 2 is received by the receiver 31 in the frequency operations unit 3 and then output to the second counter (HC4040) 37 and a shift register 41 (HC4090). As in the case of FIG. 2, the clock pulses 35 of the reference clock generator 34 synchronized with the timekeeping signal from the timekeeping device 32 that registers the standard time are applied to the second counter 37. To the second counter 37 is connected the latch unit 38 (HC573) which latches the clock pulse count from the second counter 37 in synchronism with the synchronous frequency-division-numbers data 24a.

On the other hand, the synchronous frequency-division-numbers data 24a transmitted bit-serially from the frequency dividing unit 2 is received by the receiver 31 and then converted by a shift register 41 (HC4094) into parallel data. Based on the count in the counter 37 held by the latch unit 38 and the synchronous frequency-division-numbers data 24a held by HC4094 (shift register 41), the operations circuit 39 calculates accurately the time difference between each frequency-divided signal 24. A change in the frequency of the measuring signal 21 is determined from the resulting time difference and is then operated on to determine a change in the physical quantity.

When the synchronous frequency-division-numbers data 24a is transmitted as parallel data, it can be directly latched by HC573 instead of HC4094, then the latched data is read by the operations circuit 39 for subsequent operations.

Figure 1:
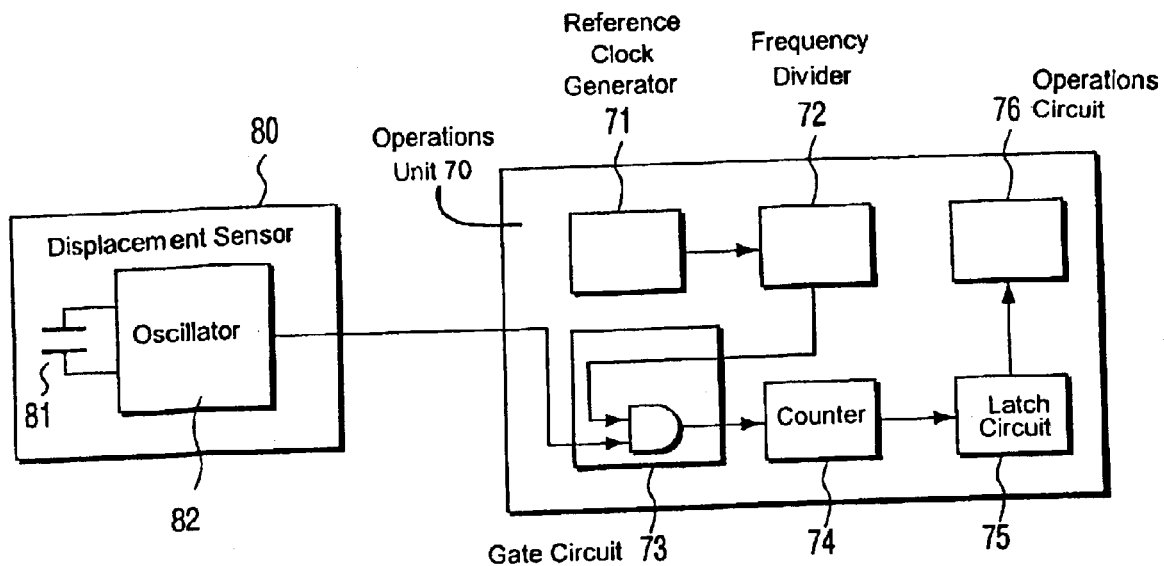
FIG. 1 is a block diagram of a conventional frequency change measuring device.
Figure 4A:
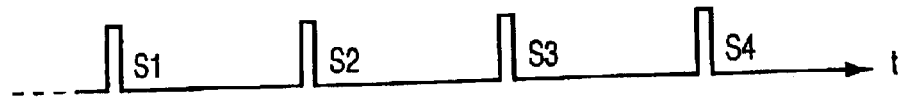
FIGS. 4A and 4B are timing diagrams in portions of the frequency change measuring device of the first embodiment.
Figure 4B:
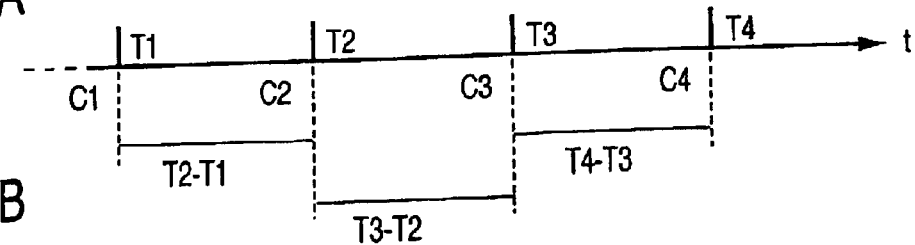

FIGS. 4A and 4B are timing diagrams illustrating the state where the frequency-divided signals are produced in FIGS. 3A and 3B. FIG. 4A shows the consecutive frequency-divided signals 22 produced in the frequency dividing unit 2. The frequency-division numbers 24 at times when the frequency-divided signals 22 are produced are transmitted with conversion into serial data S1, S2, S3, S4, . . . .The times at which the frequency-division numbers 24 are received by the frequency operations unit 3 are indicated as T1, T2, T3, T4, . . . in FIG. 4B. The frequency division numbers 24 received at those times are indicated to be C1, C2, C3, C4, . . . .

The time differences (T2−T1), (T3−T2), (T4−T3), . . . can be measured precisely from counts in the counter 37 for the frequency outputs of the reference clock generator 34 synchronous with the timekeeping device 32. A change in the frequency of the measuring signal 21 can be known from the difference between the time differences, e.g. (T2−T1). The frequency change is then operated on to determine a change in the physical quantity. Though not used in these operations, C1, C2, C3, C4, . . . are positive consecutive integers.

[Second Embodiment]

The second embodiment is a modification of the first embodiment. The second embodiment is substantially the same as the first embodiment but differs in that the frequency operations unit 3 is intermittently powered.

Figure 5A:
FIGS. 5A, 5B and 5C are timing diagrams in portions of a frequency change measuring device according to a second embodiment of the present invention.
Figure 5B:
Figure 5C:
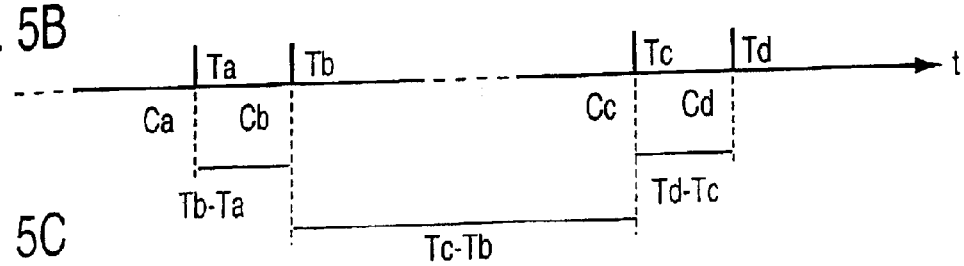

FIGS. 5A to 5C are timing diagrams illustrating the state of the frequency-divided signal 22 when the power is intermittently applied to the frequency operations unit 3 in the frequency change measuring device of the second embodiment.

FIG. 5A shows on and off states of the power supply 40 to the frequency operations unit 3. As shown, the power is applied to the frequency operations unit 3 only for intervals during which time changes in frequency are determined. This reduces the overall power dissipation of the frequency change measuring device 1.

In FIG. 5B are shown the frequency-divided signals 22 produced in the frequency dividing unit 2 as Sa, Sb, Sc, Sd, . . . . The times at which the frequency-divided signals are received by the frequency operations unit 3 are indicated as Ta, Tb, Tc, Td, . . . in FIG. 5C. The frequency division numbers 24 transmitted at those times are indicated to be Ca, Cb, Cc, Cd, . . . .

The time differences (Tb−Ta), (Tc−Tb), (Td−Tc), . . . can be measured precisely from counts in the counter 37 of the frequency outputs 35 of the reference clock generator 34 synchronous with the timekeeping device 32. Which frequency-divided signals correspond to each of the measured time differences are determined from (Cb−Ca), (Cc−Cb), (Cd−Cc), . . . . By using the frequency-divided signal receiving time differences (Tb−Ta), (T−Tb) and the difference between frequency-division numbers (Cb−Ca), (Cc−Cb), changes in the frequency output of the reference clock generator 34 synchronized with the standard time are little accumulated even if the frequency operations unit 3 is operated intermittently. Thus, the difference between times at which any pair of frequency-divided signals were received can be known correctly. As a result, a change in the frequency of the measuring signal can be measured with precision and a change in the physical quantity can be determined through operations.

In the frequency change measuring device of the present invention, as shown in FIGS. 5A to 5C, the frequency-division numbers can be used for operations and error in the measurement of frequency change is small even if the time difference between frequency divided signals to be compared is made long. In other words, even if a change in the frequency of the measuring signal is slight, a change in the physical quantity to be measured can be detected by spending much time measuring the frequency change. When the frequency change is slight, the frequency-division numbers 24 from the frequency division unit 2 are used as frequency change information while the power supply to the frequency operations unit 3 is turned on intermittently. As a result, a change in the physical quantity can be detected without using much power. By utilizing this advantage, a battery-powered frequency measuring device can be implemented which is suitable for field measurement of natural phenomena over a long time.

[Third Embodiment]

The third embodiment is a modification of the first embodiment. The third embodiment is substantially the same as the first embodiment but differs in that the frequency division unit 2 is provided at each of three separate points A, B and C. The frequency division units at the three points are denoted at 2a, 2b and 2c, respectively. In this embodiment, measurements are made by means of the three frequency division units 2a, 2b and 2c and the single frequency operations unit 3.

Figure 6A:
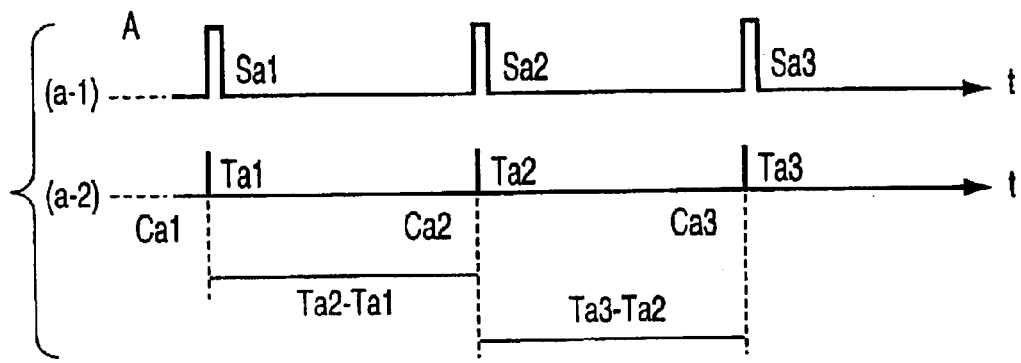
FIGS. 6A, 6B and 6C are timing diagrams in portions of a frequency change measuring device according to a third embodiment of the present invention.
Figure 6B:
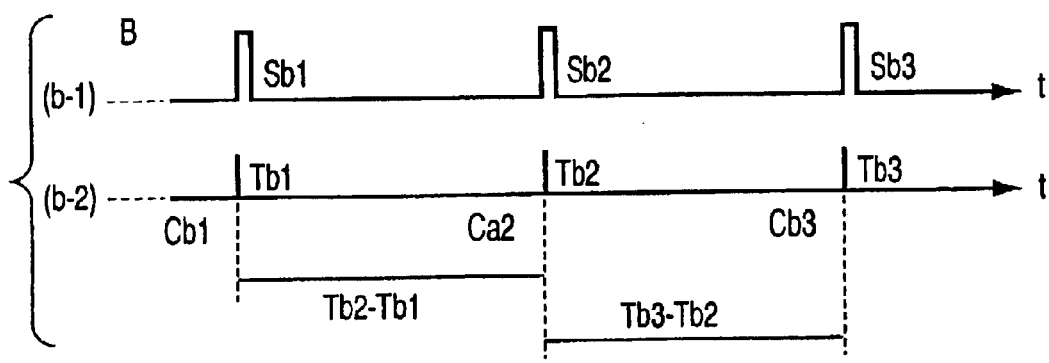
Figure 6C:
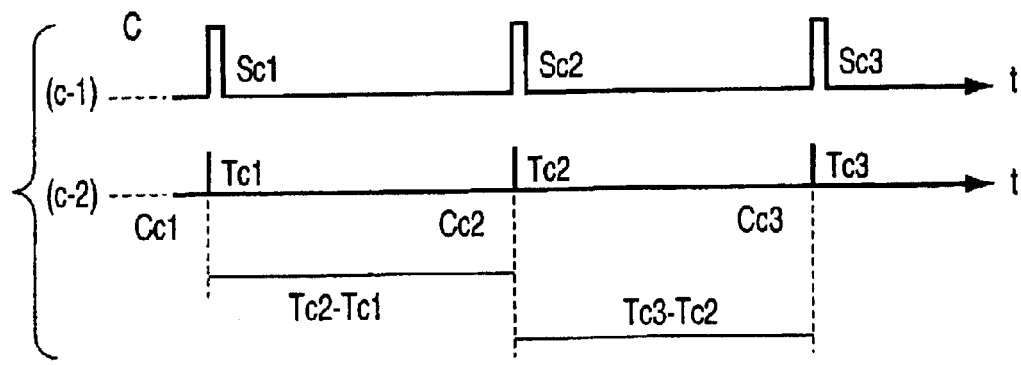

FIGS. 6A to 6C are timing diagrams of frequency-divided signals from the frequency division units 2a, 2b and 2c placed at the three points A, B and C. The timing diagram for each of the frequency division units remains unchanged from that shown in FIGS. 4A and 4B. In this example, frequency-division numbers 24 are sent from each of the points A, B and C in synchronism with frequency-divided signals 22 and received by data receiver 31a, 31b and 31c. FIG. 6A is the timing diagram at the A point, FIG. 6B is the timing diagram at the B point, and FIG. 6C is the timing diagram at the C point.

The frequency divided signals sent from the frequency division unit 2a at the A point are denoted at Sa1, Sa2, Sa3, . . . , and the times of receipt of these signals are denoted at Ta1, Ta2, Ta3, . . . . The frequency divided signals sent from the frequency division unit 2b at the B point are denoted at Sb1, Sb2, Sb3, . . . , and the times of receipt of these signals are denoted at Tb1, Tb2, Tb3, . . . . The frequency divided signals sent from the frequency division unit 2c at the C point are denoted at Sc1, Sc2, Sc3, . . . , and the times of receipt of these signals are denoted at Tc1, Tc2, Tc3, . . . .

With the frequency division units 2a, 2b and 2c placed at three points, as in the above embodiments, a change in the frequency of the measuring signal 21 can be determined from a difference between the time differences (Ta2−Ta1) and (Ta3−Ta2), between (Tb2−Tb1) and (Tb3−Tb2), and between (Tc2−Tc1) and (Tc3−Tc2). As a result, a change in the physical quantity can be determined. In this case as well, though not used in operations, frequency division numbers data 24a are sent from each frequency division unit 2a, 2b and 2c. Even if the frequency division units are provided at three or more points, a change in the physical quantity of the measuring signal 21 can be determined in the same way.

Even with the frequency division units 2a, 2b and 2c placed at three points, the power supply 40 can be turned on intermittently to measure frequency changes at the three points. In this case, unlike the timing diagrams of FIGS. 6A to 6C, the frequency division numbers 24a from the frequency operations unit 30 do not indicate contiguous positive integers. As in the case of the example shown in FIGS. 5A to 5C, a change in the frequency of the measuring signal 21 is measured via a difference between frequency division numbers 24a to determine a change in the physical quantity. Even with the frequency division units placed at three or more points, the use of frequency division numbers 24 allows a change in the physical quantity of the measuring signal 21 to be determined while the power to the frequency operations unit 3 is turned on intermittently.

When the power to the frequency operations unit 3 is turned on intermittently, a single data receiver 31 can be used by switching among frequency-divided signals from multiple frequency division units. A change in the physical quantity of each frequency division unit can be determined from the resultant data in the same way as in the previously described embodiments. This embodiment does not need to provide a plurality of data receiver 31, making the frequency operations unit 3 compact and handy to carry about.

[Fourth Embodiment]

This embodiment, which is a modification of the second embodiment, is directed to a detailed arrangement for turning on the power to the frequency operations unit intermittently.

Figure 7:
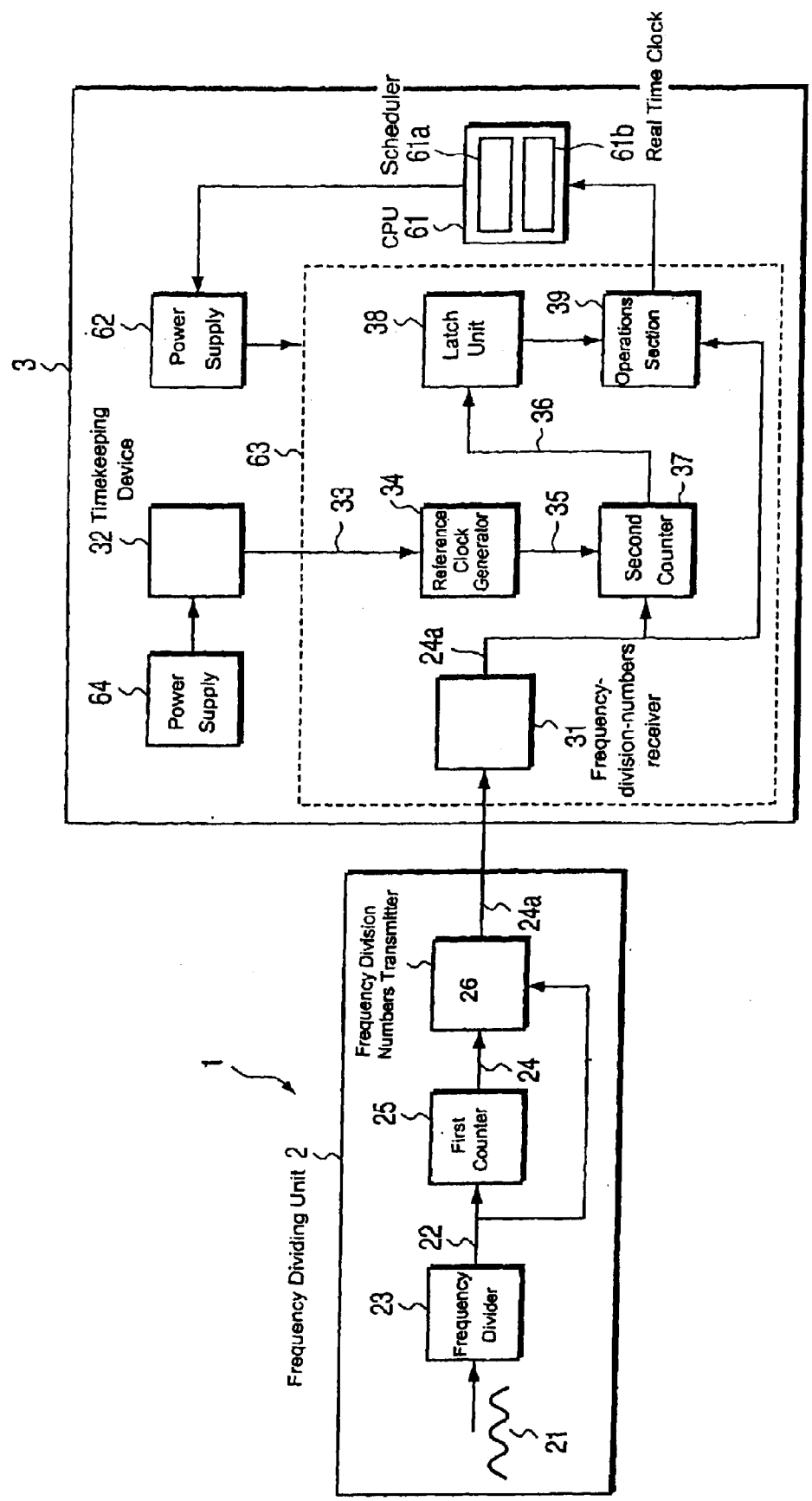
FIG. 7 is a block diagram of a frequency change measuring device according to a fourth embodiment of the present invention.

FIG. 7 is a block diagram of a frequency change measuring device according to the fourth embodiment. In this figure, like reference numerals are used to denote corresponding parts to those in FIG. 2 and detailed descriptions thereof are omitted.

As shown in FIG. 7, the arrangement of the frequency division unit 2 remains unchanged from that in FIG. 2. In this embodiment, the results of operations by operations processor 39 are output to a CPU 61, which is adapted to schedule operations of the frequency operations unit 3 and has a scheduler 61a and a real time clock 61b built in. The scheduler 61a predicts the timing of transmission of the next frequency-division numbers data 24a from the frequency division unit 2 on the basis of the results of operations by the operations processor 39 and schedules it. The real time clock 61b is operated based on that schedule. In this embodiment, the real time clock 61b is used as a pulse generator to turn on and off the power supply at precise time intervals.

More specifically, immediately before the predicted time by the scheduler 61a of receipt of frequency-division numbers data 24a, the reference clock generator 34 is corrected. At the time of receipt of the frequency-division numbers data, operations are performed by the operations processor 39. Based on the results of the operations, the next schedule is set by the scheduler 61a and a power supply 62 to a power supplied section 63 enclosed by broken line is turned off. Thereby, the measurement of frequency changes can be made with reduced power dissipation. The power supplied section 63 comprises the frequency division numbers data receiving section 31, the reference clock generator 34, the second counter 37, the latch unit 38, and the operations processor 39.

At the arrival of the power-on time set by the scheduler 61a, the real time clock 61b is operated to turn on the power supply 62. As a result, the power is supplied to the components 31, 34, 35, 37, 38, and 39 in the power supplied section 63.

A power supply 64 is connected to the timekeeping device 32. When using a GPS clock or electromagnetic wave clock, the power supply 64 receives a timekeeping signal of the standard clock and corrects the normally operating reference clock generator 34 with that signal. Usually, the timekeeping device 32 can provide the precise time by receiving electromagnetic waves containing timekeeping information for one minute or so. The time can be corrected in about two minutes. Therefore, the power supply 64 to the timekeeping device 32 is simply turned on two or three minutes before operations processing by the operations processor. Of course, the power-on time of the power supply 64 may be scheduled by the scheduler 61a.

Although, in the second embodiment, the frequency division unit 2 has been described as having the same arrangement as in FIG. 2, this is not restrictive. For example, by using the output of an AND gate receiving low-order bits of the HC4040 counter of FIG. 3A used as the frequency divider 23, the power to the frequency division numbers transmitter 26 can be turned on immediately prior to the transmission of the frequency division numbers data 24a. In this case, a further reduction in power dissipation can be effected. Particularly, in transmitting the frequency division numbers data by radio communication, a battery is often used. By applying the power to the transmitter 26 only during a required period of time and thereby reducing power dissipation, the measurement can be made over a very long period of time.

Although the transmission of the frequency division numbers data between the transmitter 26 and the receiver 31 has been described as being made by radio communication using electromagnetic waves or infrared rays, this is not restrictive. For example, the transmitter 26 and the receiver 31 may be connected together by means of a cable or optical fiber. With outdoor observation, the use of electromagnetic waves or infrared rays provides an advantage that the frequency division unit 2 and the frequency operations unit 3 can be placed at a distance from each other.

In addition, although the frequency dividing unit 2 and the frequency operations unit 3 have been described as being provided separately, this is not restrictive; they may be packed together. In this case, the transmitter 26 and the receiver 31 can be omitted, resulting in a further reduction in device size and power dissipation.

Although the measuring signal 21 has not been described specifically in the above embodiments, any signal can be used provided that it can determine a change in physical quantity from a change in frequency. Thus, the present invention is not limited to the use of the variable-capacitance displacement sensor 21a whose capacitance varies with the measuring signal 21. For example, when the physical quantity is distance to an object to be measured, an ultrasound generator and an ultrasound detector can be used in place of the variable-capacitance displacement sensor 21a to detect a measuring signal. In this case, the distance to an object can be obtained as the frequency of ultrasound by emitting an ultrasound beam to the object and detecting a reflected beam from the object. In this case, the object to be measured may be the river level, the sea level, the water level in deep wells, the rain level, the snow level, etc. For example, in the case of the rain level, the amount of rainfall can be measured by storing rain and measuring the water level. With the snow level, the snowfall can be measured. When the measuring signal 21a is detected by an ultrasound generator and an ultrasound detector, an operation of emitting an ultrasound beam from the ultrasound generator in synchronism with the detection of a reflected ultrasound beam by the ultrasound detector can be repeated. Instead of using ultrasound, electromagnetic waves or light can be used to measure the distance to the object. In the case of electromagnetic waves, a measuring signal can be obtained by emitting electromagnetic waves from an electromagnetic wave generator to an object and emitting electromagnetic waves again in synchronism with the detection of electromagnetic waves reflected from the object by an electromagnetic wave detector.

The present invention can be adapted to measure other physical quantities than the distance to an object. For example, when the physical quantity is the velocity of wind, the rotational speed of an anemometer used in meteorology can be used as a measuring signal 21a to determine the average wind velocity. When the physical quantity is the flow velocity of ocean current, tidal current, river current, or water flowing in pipes, a blade wheel current meter can be used to measure the flow velocity. By converting the rotation of a wheel into a change in frequency, frequency dividing the frequency output in the frequency division unit 2 and sending frequency-division numbers data 24 to the frequency operations unit 3, the number of rotations can be measured.

Besides, in case of measurement of a temperature which varies periodically, the frequency change which corresponds to the temperature change may be obtained from an output of a temperature sensor.

With a semiconductor device as a measuring object and its electrical property as a physical quantity, the present invention can be adapted to detect the electrical property as a frequency change. In this case, for example, by flowing a current between paired electrodes to thereby produce a magnetic field perpendicularly to the surface of other electrodes which are disposed opposite to each other in the direction perpendicular to the surface of the paired electrodes and detecting a voltage produced between the other electrodes as a frequency change, a change in the carrier density in the semiconductor device resulting from its operation can be measured on the basis of the Hall effect. If other electrical properties of the semiconductor device can be detected by the variable-capacitance sensor, their changes can be known readily. Of course, the present invention can also be adapted to detect a frequency change in the optical property of the semiconductor device. For electrical properties of discrete devices, such as diodes, transistors, capacitors, etc., the present invention can be adapted if the properties can be converted into frequency changes.

Thus, the present invention can be adapted for any type of physical quantity, such as mass, pressure, velocity, flow velocity, flow rate, viscosity, temperature, electrical property, optical property, etc., provided that its change can be converted into a frequency change.

According to the present invention, as described in detail above, frequency changes can be measured without the need of a thermostatic oven for stabilizing the frequency output of a reference clock generator.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency change measuring device comprising:
   at least one frequency divider or frequency dividing a measuring signal having a frequency that is varied by a change in a physical quantity to produce frequency-divided signals;
   at least one counter for counting the frequency-divided signals to calculate frequency-division numbers;
   at least one frequency division numbers transmitter for transmitting the frequency division numbers in synchronism with the frequency-divided signals;
   a frequency division numbers receiver for receiving the frequency division numbers transmitted from the frequency division numbers transmitter to output the frequency division numbers;
   a reference clock generator for generating reference clocks; and
   an operations unit for determining a change in the frequency of the measuring signal on the basis of the frequency outputs of the reference clock generator and the frequency division numbers, wherein said operations unit:
   counts a number of reference clock pulses generated by the reference clock generator during a time period between first and second timings of outputting the frequency division numbers from the frequency division numbers receiver,
   calculates a difference between the frequency division numbers output at the first and second timings, and
   determines the change in frequency of the measuring signal based on the number of reference clock pulses generated during the time period and the difference between the frequency division numbers output at the first and second timings.

2. A frequency change measuring device comprising:
   at least one frequency divider for frequency dividing a measuring signal having a frequency that is varied by a change in physical quantity to produce frequency-divided signals;
   at least one first counter for counting the frequency-divided signals to calculate frequency-division numbers;
   at least one frequency division numbers transmitter for transmitting the frequency division numbers in synchronism with the frequency-divided signals;
   a frequency division numbers receiver for receiving the frequency division numbers transmitted from the frequency division numbers transmitter to output the frequency division numbers;
   a second counter for counting an output of a reference clock generator which generates reference clock pulses;
   a latch unit for latching a count of the second counter on the basis of signals synchronous with the frequency division numbers from the frequency division numbers receiver; and
   an operations unit for determining a change in the frequency of the measuring signal on the basis of the count latched by the latch unit and the frequency division numbers, wherein the operations unit:
   calculates a difference between the count latched by the latch unit at a first time and the count latched by the latch unit at a second time, and
   determines the change in frequency of the measuring signal based on the difference between the counts latched by the latch unit at the first and second times and a difference between the frequency division numbers at the first and second times.

* * * * *